United States Patent
Shindo et al.

(10) Patent No.: US 9,340,850 B2
(45) Date of Patent: May 17, 2016

(54) PROCESS FOR PRODUCING HIGH-PURITY TIN

(71) Applicant: JX Nippon Mining & Metals Corporation, Tokyo (JP)

(72) Inventors: Yuichiro Shindo, Ibaraki (JP); Kouichi Takemoto, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 45 days.

(21) Appl. No.: 14/340,933

(22) Filed: Jul. 25, 2014

(65) Prior Publication Data

US 2014/0332404 A1 Nov. 13, 2014

Related U.S. Application Data

(62) Division of application No. 11/916,906, filed as application No. PCT/JP2006/311912 on Jun. 14, 2006.

(30) Foreign Application Priority Data

Jul. 1, 2005 (JP) .................................. 2005-193323

(51) Int. Cl.

| | |
|---|---|
| *C22B 3/00* | (2006.01) |
| *C22C 13/00* | (2006.01) |
| *C25F 1/04* | (2006.01) |
| *C22B 25/08* | (2006.01) |
| *C22F 1/16* | (2006.01) |
| *C25C 1/14* | (2006.01) |
| *C22B 13/06* | (2006.01) |
| *H01L 23/482* | (2006.01) |

(52) U.S. Cl.
CPC ................. *C22B 25/04* (2013.01); *C22B 25/08* (2013.01); *C22C 13/00* (2013.01); *C22F 1/16* (2013.01); *C25C 1/14* (2013.01); *C25F 1/04* (2013.01); *C22B 13/06* (2013.01); *H01L 23/4827* (2013.01); *H01L 2224/13111* (2013.01); *H01L 2924/10253* (2013.01)

(58) Field of Classification Search
CPC ........ C22B 13/06; C22B 25/04; C22B 25/08; C22C 13/00; C22F 1/16; H01L 23/4827; H01L 2224/1311; H01L 2924/1025
USPC ................... 148/538, 557; 164/76.1; 205/723
See application file for complete search history.

(56) References Cited

U.S. PATENT DOCUMENTS

| | | | |
|---|---|---|---|
| 1,964,948 A * | 7/1934 | Hibbard et al. ............... | 205/614 |
| 4,800,024 A | 1/1989 | Elfline | |
| 5,217,585 A | 6/1993 | Snyder et al. | |
| 2004/0132299 A1 | 7/2004 | Matsuda et al. | |
| 2013/0028786 A1 | 1/2013 | Kanou | |

FOREIGN PATENT DOCUMENTS

| | | |
|---|---|---|
| JP | S62-1478 B2 | 1/1987 |
| JP | S62-47955 B2 | 10/1987 |
| JP | H01-283398 A | 11/1989 |
| JP | H02-228487 A | 9/1990 |
| JP | H05-77087 A | 3/1993 |
| JP | H06-182580 A | 7/1994 |
| JP | H09-260427 A | 10/1997 |
| JP | H11-80852 A | 3/1999 |
| JP | H11-343590 A | 12/1999 |
| JP | 2001-009588 A | 1/2001 |
| JP | 2001-082538 A | 3/2001 |
| JP | 2001-271159 A | 10/2001 |
| JP | 2003-193283 A | 7/2003 |
| JP | 2003-303787 A | 10/2003 |
| JP | 2004-244711 A | 9/2004 |

OTHER PUBLICATIONS

A.D. Styrkas et al., "Two Novel Methods of the Production of High Purity Tin Powders with Reduced Oxygen Content", Powder Technology, vol. 104, No. 2, pp. 164-168, Sep. 1999.
Chinese Publication Listing Chinese National Voluntary Standards (/T) for Non-Ferrous Metallurgy (YS)—YS/T 44-92, pp. 173-174, Mar. 1992.
Chinese Publication Listing Chinese National Voluntary Standards (/T) for Non-Ferrous Metallurgy (YS)—YS/T 44/1992, and for Casting Bearing Alloy Ingots—GB/T 8740-2005, pp. 144, Feb. 2009.

\* cited by examiner

*Primary Examiner* — Sikyin Ip
(74) *Attorney, Agent, or Firm* — Howson & Howson LLP

(57) ABSTRACT

High purity tin and tin alloy are provided in which the respective contents of U and Th are 5 ppb or less, the respective contents of Pb and Bi are 1 ppm or less, and the purity is 5N or higher, provided that this excludes the gas components of O, C, N, H, S and P. A cast ingot of the tin or alloy has an α ray count of 0.001 cph/cm$^2$ or less. Since recent semiconductor devices are densified and of large capacity, there is risk of a soft error occurring due to α ray from materials in the vicinity of the semiconductor chip. Thus, there are demands for purifying soldering material used in the vicinity of semiconductor devices, and materials with fewer α rays. The disclosed tin, alloy, and method reduce α dose of tin so as to be adaptable as the foregoing material.

2 Claims, No Drawings

PROCESS FOR PRODUCING HIGH-PURITY TIN

CROSS REFERENCE TO RELATED APPLICATIONS

This application is a divisional of co-pending U.S. patent application Ser. No. 11/916,906 which is the National Stage of International Application No. PCT/JP2006/311912, filed Jun. 14, 2006, which claims the benefit under 35 USC §119 of Japanese Application No. 2005-193323, filed Jul. 1, 2005.

BACKGROUND

The present invention relates to high purity tin or tin alloy with reduced a dose of tin to be used in the manufacture of semiconductor manufacturing equipment or the like, and to a manufacturing method of such high purity tin.

Generally, tin is a material that is used in the manufacture of semiconductors, and in particular is a primary ingredient of solder material. When manufacturing semiconductors, soldering is used to bond a semiconductor chip and substrate, to bond or seal a Si chip such as an IC or LSI to or in a lead frame or a ceramics package, to form bumps during TAB (Tape Automated Bonding) or during the manufacture of flip chips, or on semiconductor wiring materials.

Since recent semiconductor devices are densified and of high capacity, there is considerable risk that a soft error may occur due to the influence of $\alpha$ rays from materials in the vicinity of the semiconductor chip. In light of the above, there are demands for high purification of the foregoing solder material and tin, as well as for the realization of materials with fewer $\alpha$ rays.

There are several disclosures relating to technology aiming to reduce $\alpha$ rays from tin. These technologies are described below.

Japanese Patent No. 3528532 (corresponding to Japanese Patent Laid-Open Publication No. H11-80852 A) describes a manufacturing method of low $\alpha$ ray tin including the steps of alloying tin and lead having an a dose of 10 $cph/cm^2$ or less, and thereafter removing the lead contained in the tin by refining. The object of this technology is to reduce the a dose by diluting the $^{210}$Pb in the tin through the addition of high purity Pb. Nevertheless, in the foregoing case, such a complicated process is required as to additionally remove Pb after adding it to the tin. In addition, although the numerical value of the a dose is considerably low after the lapse of 3 years after refining the tin, this can also be comprehended as not being able to use the tin with the low a dose until 3 years has lapsed from the refining of the tin, and it cannot be said that this is an industrially efficient method.

Japanese Patent No. 3227851 (corresponding to Japanese Patent Laid-Open Publication No. H06-182580 A) describes that the radiation $\alpha$ particle count can be reduced to 0.5 $cph/cm^2$ or less by adding 10 to 5000 ppm of a material selected among Na, Sr, K, Cr, Nb, Mn, V, Ta, Si, Zr and Ba to a Sn—Pb alloy solder. Nevertheless, even with the addition of the foregoing materials, the radiation $\alpha$ particle count could only be reduced to a level of 0.015 $cph/cm^2$, and this has not achieved a promising level as a present-day material for semiconductor devices. Another problem lies in that elements such as alkali metal elements, transition metal elements and heavy metal elements which are undesirable to be mixed in the semiconductor are used as the additive materials. Therefore, there is no choice but to say that this is low level as a material to be used for assembling semiconductor devices.

Japanese Patent No. 2913908 (corresponding to Japanese Patent Laid-Open Publication No. H05-77087 A) describes reducing the count of radiation $\alpha$ particles emitted from solder ultra fine wires to 0.5 $cph/cm^2$ or less, and using the same as the connection wiring of semiconductor devices. Nevertheless, this kind of count level of radiation particles is not at a level as a present-day material for semiconductor devices.

Japanese Patent No. 2754030 (corresponding to Japanese Patent Laid-Open Publication No. H02-228487 A) describes using highly refined sulfuric acid such as top-grade sulfuric acid and highly refined hydrochloric acid such as top-grade hydrochloric acid in order to obtain an electrolytic solution, and using high purity tin as the anode to perform electrolysis so as to obtain high purity tin having low lead concentration and a lead $\alpha$ ray count of 0.005 $cph/cm^2$ or less. It goes without saying that a high purity material can be obtained by using a high purity raw material (reagent) without regard to cost, but the lowest $\alpha$ ray count of the deposited tin indicated in the Examples of Japanese Patent No. 2754030 (corresponding to Japanese Patent Laid-Open Publication No. H02-228487 A) is 0.002 $cph/cm^2$, and an expected level cannot be achieved despite the high cost.

Japanese Patent Laid-Open Publication No. H11-343590 describes a manufacturing method for obtaining metallic tin of 5N or higher through electrowinning performed with the electrolytic solution that is obtained according to the procedures, which are precipitation of metastannic acid by adding nitric acid to a heated aqueous solution previously added with crude metallic tin, filtration, cleaning, and thereafter dissolution of such metastannic acid in hydrochloric acid or hydrofluoric acid. Although this technology vaguely describes its application in semiconductor devices, there is no specific reference to the limitation of U and Th as the radioactive elements or the radiation $\alpha$ particle count, and it could be said that the interest concerning the foregoing limitation is of a low level according to the disclosure of Japanese Patent Laid-Open Publication No. H11-343590.

Japanese Patent Laid-Open Publication No. H9-260427 describes technology of reducing the amount of Pb contained in Sn constituting the solder alloy, and using Bi, Sb, Ag or Zn as the alloy material. Nevertheless, even if the amount of Pb is reduced as much as possible in the foregoing case, Japanese Patent Laid-Open Publication No. H9-260427 does not particularly disclose any means for fundamentally overcoming the problem of the radiation $\alpha$ particle count caused by Pb that gets mixed in inevitably.

Japanese Patent Laid-Open Publication No. H1-283398 discloses tin having a grade of 99.99% or higher and a radiation $\alpha$ particle count of 0.03 $cph/cm^2$ or less manufactured by performing electrolysis using a top-grade sulfuric acid reagent. Also in this case, it goes without saying that a high purity material can be obtained by using a high purity raw material (reagent) without regard to cost, but the lowest $\alpha$ ray count of the deposited tin indicated in the Examples of Japanese Patent Laid-Open Publication No. H1-283398 is 0.003 $cph/cm^2$, and an acceptable level cannot be achieved despite the high cost.

Japanese Patent Laid-Open Publication No. S62-47955 describes lead as a brazing filler metal for use in semiconductor devices having a grade of 4N or higher, radioisotope of less than 50 ppm, and a radiation $\alpha$ particle count of 0.5 $cph/cm^2$ or less. In addition, Japanese Patent Laid-Open Publication No. S62-1478 describes tin as a brazing filler metal for use in semiconductor devices having a grade of 99.95% or higher, radioisotope of less than 30 ppm, and a radiation $\alpha$ particle count of 0.2 $cph/cm^2$ or less. Both Japanese Patent Laid-Open Publication No. S62-47955 and Japanese Patent Laid-Open Publication No. S62-1478 have a lenient allowable value concerning the radiation α particle count, and there is a problem in that the technology described in these Documents is not at a level as a present-day material for semiconductor devices.

Although Japanese Patent Laid-Open Publication No. 2001-82538 shows an example of Sn having a purity of 99.999% (5N), this Sn is to be used as a metal plug material for a seismic isolation structure, and there is no description concerning the limitation of U and Th as the radioactive elements or the radiation α particle count. This kind of material cannot be used as a material for assembling semiconductor devices.

Japanese Patent Laid-Open Publication No. H7-280998 discloses a method of eliminating technetium from nickel contaminated with a large quantity of technetium (Tc), uranium and thorium by using graphite or activated carbon powder. The reason for this is because, when attempting to eliminate technetium with electrolytic refining, technetium will follow nickel and codeposit on the cathode, and cannot be separated from such cathode. In other words, technetium as the radioactive material contained in the nickel cannot be eliminated with electrolytic refining. The technology of Japanese Patent Laid-Open Publication No. H7-280998 relates specifically to nickel contaminated with technetium, and cannot be applied to other substances. In addition, Japanese Patent Laid-Open Publication No. H7-280998 merely relates to low-level technology in terms of high purification of treating industrial wastes that are harmful to the human body, and is not at a level as a material for semiconductor devices.

SUMMARY

Since recent semiconductor devices are densified and of large capacity, there is considerable risk of a soft error occurring due to the influence of α ray from materials in the vicinity of the semiconductor chip. In particular, there are strong demands for purifying the soldering material or tin to be used in the vicinity of semiconductor devices, as well as for the realization of materials with fewer α rays. Thus, an object of the present invention is to provide high purity tin or tin alloy and the manufacturing method of such high purity tin by reducing a dose of tin so as to be adaptable as the foregoing material.

In order to achieve the foregoing object, the present invention provides high purity tin or tin alloy wherein the respective contents of U and Th as radioactive elements are 5 ppb or less, the respective contents of Pb and Bi that emit radiation α particles are 1 ppm or less, and the purity is 5N or higher (provided that this excludes the gas components of O, C, N, H, S and P). The present invention aims at eliminating as much as possible the influence of α ray on semiconductor chips. (Incidentally, the signs of %, ppm and ppb used herein all represent weight (wt).)

The high purity tin or tin alloy of the present invention is ultimately manufactured by being rolled and cut when needed as well as being dissolved and cast. It is desirable that α ray count of such high purity tin is 0.001 cph/cm$^2$ or less. The high purity tin or tin alloy of the present invention realizes the foregoing numerical value.

The manufacture of high purity tin is particularly important in the present invention, and, as a manufacturing method of such high purity tin, the present invention includes the steps of leaching tin as the raw material with acid (sulfuric acid, for instance), using the obtained leachate as an electrolytic solution, suspending an adsorbent of impurities in the electrolytic solution, and performing electrolytic refining using a raw material Sn anode so as to obtain high purity tin wherein the respective contents of U and Th as radioactive elements are 5 ppb or less, the respective contents of Pb and Bi that emit radiation α particles are 1 ppm or less, and the purity is 5N or higher (provided that this excludes the gas components of O, C, N, H, S and P).

Since both Pb and Bi have a similar potential as Sn, there is a problem in that these elements are difficult to eliminate. The present invention, however, realizes the effective elimination of these elements with the foregoing method. Oxides such as titanium oxide, aluminum oxide and tin oxide, activated carbon and carbon may be used as the adsorbent to be suspended in the electrolytic solution.

Moreover, the high purity tin obtained based on the foregoing electrolytic refining is dissolved and cast at 250 to 500° C., and α ray count of the cast ingot after the lapse of 6 months or longer is made to be 0.001 cph/cm$^2$ or less. When casting Sn, there is the incorporation of radon and the evaporation of polonium, and the precise measurement of the actual impurities and a dose in Sn is difficult. Therefore, the lapse of 6 months or longer is required for the foregoing impurities and a dose to stabilize. In other words, with the present invention, it could be said that α ray count stabilizes at 0.001 cph/cm$^2$ or less after the lapse of 6 months or longer.

As the additive component (alloy component) of high purity tin alloy, silver, copper, zinc and the like may be used, but the additive component (alloy component) is not limited to the foregoing elements. Although the standard additive amount is 0.1 to 20 wt %, there is no limitation on this amount either. It is necessary to similarly use high purity materials.

The high purity tin or tin alloy of the present invention has a purity of 5N or higher (provided that this excludes the gas components of O, C, N, H, S and P), and is further characterized in that the respective contents of U and Th as the radioactive elements are 5 ppb or less, and the respective contents of Pb and Bi that emit radiation α particles are 1 ppm or less, and it is therefore possible to eliminate as much as possible the influence of the α ray on semiconductor chips.

The high purity tin or tin alloy of the present invention is ultimately manufactured by being dissolved and cast, and it yields a superior effect in that it is able to make the α ray count of such high purity tin 0.001 cph/cm$^2$ or less. It is thereby possible to considerably reduce the occurrence of soft errors caused by the influence of a rays of the semiconductor device.

DETAILED DESCRIPTION

As the raw material tin, commercially available tin having a purity level of 2 to 3N is used. The raw material tin, however, does not have to be limited to the foregoing commercially available product. The raw material tin is leached with acid, and the obtained leachate is used as the electrolytic solution. As the acid to be used, hydrochloric acid, sulfuric acid and the like are preferably used.

Sn having a purity level of 2 to 4N is used as the anode. Subsequently, electrolysis is performed under the conditions of electrolysis temperature of 10 to 80° C., and current density of 0.1 to 50 A/dm$^2$.

Oxides such as titanium oxide, aluminum oxide, tin oxide and the like, activated carbon and carbon are suspended in the electrolytic solution in order to adsorb the impurities. This is particularly effective in eliminating Pb and Bi.

As a result of performing refining after the electrolysis described above, it is possible to make the respective contents of U and Th as the radioactive elements 5 ppb or less, and the respective contents of Pb and Bi that emit radiation α particles 1 ppm or less. As described above, the reduction in the Pb content and Bi content, as well as the U content and Th content is particularly due to the foregoing electrolytic conditions and the suspended solids.

The deposited electrolytic tin is dissolved and cast at a temperature of 250 to 500° C. to prepare a tin ingot. This temperature range is effective in eliminating the radioactive elements such as Po. If the temperature is below 250° C. and directly on the melting point, this is not preferable since casting is difficult, and if the temperature exceeds 500° C., this is not preferable since Sn will evaporate. Therefore, the electrolytic tin is dissolved and cast within the foregoing temperature range.

The cast tin ingot was stored for 6 months in an inert gas atmosphere or a vacuum (reduced pressure). When checking the α dose after the lapse of 6 months, the α ray count decreased and it was possible to make it 0.001 cph/cm$^2$ or less.

The same applies to the case of a tin alloy, and a high purity material in which the respective contents of U and Th as the radioactive elements and the respective contents of Pb and Bi that emit radiation α particles satisfy the conditions of the present invention is selected as the additive element material and alloyed to obtain the tin alloy of the present invention. The manufacturing process is the same as the case of manufacturing the foregoing tin ingot.

temperature of 20° C. and current density of 1 A/dm$^2$. The analytical values of the raw material tin are shown in Table 1.

Further, 50 g/L of titanium oxide (TiO$_2$) was placed in the electrolytic solution and suspended. As a result of performing refining after the foregoing electrolysis, the Pb content was 0.7 ppm and the Bi content was 0.1 ppm. The respective contents of U and Th were less than 5 ppb. Regarding the reduction of the Pb content and Bi content as well as the U content and Th content, the reason why Pb and Bi as impurities decreased is because they were adsorbed to the suspended titanium oxide, and the reason why U and Th as impurities decreased is because of the electrolysis.

The deposited electrolytic tin was dissolved and cast at a temperature of 260° C. to prepare a tin ingot. The cast tin ingot was stored for 6 months in an argon gas atmosphere. As a result of checking α dose after the lapse of 6 months, α ray count was 0.0007 cph/cm$^2$. The analytical values of the refined tin are similarly shown in Table 1.

The respective contents of U and Th as radioactive elements were 5 ppb or less, the respective contents of Pb and Bi that emit radiation α particles were 1 ppm or less, and the α ray count was 0.001 cph/cm$^2$ or less. These values satisfied the target of the present invention. It was thereby possible to obtain a high purity tin material that is suitable for the manufacture of semiconductor devices.

TABLE 1

| Element | Raw Material | Example 1 | Example 2 | Example 3 | Example 4 | Comparative Example 1 |
|---|---|---|---|---|---|---|
| Al | 1.0 | <0.01 | <0.01 | <0.01 | <0.01 | <0.01 |
| S | 11 | 6 | 3 | 0.02 | 6 | 6 |
| Fe | 60 | <0.01 | <0.01 | <0.01 | <0.01 | <0.01 |
| Co | 10 | <0.1 | <0.1 | <0.1 | <0.1 | <0.1 |
| Ni | 48 | <0.1 | <0.1 | <0.1 | <0.1 | <0.1 |
| Cu | 26 | 0.3 | 0.1 | 0.3 | 0.3 | 0.3 |
| As | 130 | 0.05 | <0.05 | 0.05 | 0.05 | 0.05 |
| Cd | 2 | <0.05 | <0.05 | <0.05 | <0.05 | <0.05 |
| In | 19 | <1 | <1 | <1 | <1 | <1 |
| Sb | 63 | <0.5 | <0.5 | <0.5 | <0.5 | <0.5 |
| Te | 0.5 | <0.1 | 0.1 | <0.1 | <0.1 | <0.1 |
| Pb | 220 | 0.7 | 0.1 | 0.9 | 0.06 | 200 |
| Bi | 98 | 0.1 | 0.05 | 0.3 | 0.01 | 20 |
| U | 0.5 | <0.005 | <0.005 | <0.005 | <0.005 | 0.01 |
| Th | 0.8 | <0.005 | <0.005 | <0.005 | <0.005 | 0.006 |
| α dose | 8.6 | 0.0007 | 0.0007 | 0.0009 | <0.0005 | 8.0 |

Content of respective elements: wtppm; α dose: cph/cm$^2$

The high purity tin or tin alloy of the present invention obtained as described above yields a superior effect of being able to considerably reduce the occurrence of soft errors caused by the influence of α rays of the semiconductor device.

EXAMPLES

The Examples of the present invention are now explained. Incidentally, these Examples merely illustrate an example of the present invention, and do not limit the present invention in any way. In other words, this invention covers other modes and modifications contained in the technical spirit of the present invention.

Example 1

Raw material tin was leached with sulfuric acid, and the obtained leachate was used as the electrolytic solution. Sn having a purity level of 3N was used as the anode. Electrolysis was performed thereto under the conditions of electrolysis Example 2

Raw material tin was leached with sulfuric acid, and the obtained leachate was used as the electrolytic solution. The same Sn as Example 1 having a purity level of 3N was used as the anode. Electrolysis was performed thereto under the conditions of electrolysis temperature of 25° C. and current density of 3 A/dm$^2$.

Further, 10 g/L of activated carbon was placed in the electrolytic solution and suspended. As a result of performing refining after the foregoing electrolysis, the Pb content was 0.1 ppm and the Bi content was 0.05 ppm. The respective contents of U and Th were less than 5 ppb. Regarding the reduction of the Pb content and Bi content as well as the U content and Th content, the reason why Pb and Bi as impurities decreased is because they were adsorbed to the suspended activated carbon, and the reason why U and Th as impurities decreased is because of the electrolysis.

The deposited electrolytic tin was dissolved and cast at a temperature of 500° C. to prepare a tin ingot. The cast tin ingot was stored for 10 months in a nitrogen atmosphere. As a result of checking the α dose after the lapse of 10 months, α ray count was 0.0005 cph/cm². The analytical values of the refined tin are similarly shown in Table 1.

The respective contents of U and Th as radioactive elements were 5 ppb or less, the respective contents of Pb and Bi that emit radiation α particles were 1 ppm or less, and the α ray count was 0.001 cph/cm² or less. These values satisfied the target of the present invention. It was thereby possible to obtain a high purity tin material that is suitable for the manufacture of semiconductor devices.

Example 3

Raw material tin was leached with hydrochloric acid, and the obtained leachate was used as the electrolytic solution. The same Sn as Example 1 having a purity level of 3N was used as the anode. Electrolysis was performed thereto under the conditions of electrolysis temperature of 50° C. and current density of 10 A/dm².

Further, 40 g/L of carbon was placed in the electrolytic solution and suspended. As a result of performing refining after the foregoing electrolysis, the Pb content was 0.9 ppm and the Bi content was 0.3 ppm. The respective contents of U and Th were less than 5 ppb. Regarding the reduction of the Pb content and Bi content as well as the U content and Th content, the reason why Pb and Bi as impurities decreased is because they were adsorbed to the suspended carbon, and the reason why U and Th as impurities decreased is because of the electrolysis.

The deposited electrolytic tin was dissolved and cast at a temperature of 350° C. to prepare a tin ingot. The cast tin ingot was stored for 20 months in a vacuum. As a result of checking the α dose after the lapse of 20 months, α ray count was 0.0009 cph/cm². The analytical values of the refined tin are similarly shown in Table 1.

The respective contents of U and Th as radioactive elements were 5 ppb or less, the respective contents of Pb and Bi that emit radiation α particles were 1 ppm or less, and α ray count was 0.001 cph/cm² or less. These values satisfied the target of the present invention. It was thereby possible to obtain a high purity tin material that is suitable for the manufacture of semiconductor devices.

Example 4

Raw material tin was leached with hydrochloric acid, and the obtained leachate was used as the electrolytic solution. The same Sn as Example 1 having a purity level of 3N was used as the anode. Electrolysis was performed thereto under the conditions of electrolysis temperature of 40° C. and current density of 15 A/dm².

Further, 50 g/L of tin oxide was placed in the electrolytic solution and suspended. As a result of performing refining after the foregoing electrolysis, the Pb content was 0.06 ppm and the Bi content was 0.01 ppm. The respective contents of U and Th were less than 5 ppb. Regarding the reduction of the Pb content and Bi content as well as the U content and Th content, the reason why Pb and Bi as impurities decreased is because they were adsorbed to the suspended tin oxide, and the reason why U and Th as impurities decreased is because of the electrolysis.

The deposited electrolytic tin was dissolved and cast at a temperature of 400° C. to prepare a tin ingot. The cast tin ingot was stored for 50 months in a desiccator. As a result of checking α dose after the lapse of 50 months, α ray count was less than 0.0005 cph/cm². The analytical values of the refined tin are similarly shown in Table 1.

The respective contents of U and Th as radioactive elements were 5 ppb or less, the respective contents of Pb and Bi that emit radiation α particles were 1 ppm or less, and the α ray count was 0.001 cph/cm² or less. These values satisfied the target of the present invention. It was thereby possible to obtain a high purity tin material that is suitable for the manufacture of semiconductor devices.

Comparative Example 1

Raw material tin was leached with sulfuric acid, and the obtained leachate was used as the electrolytic solution. Sn having a purity level of 3N was used as the anode. Electrolysis was performed thereto under the same conditions as Example 1; that is, the conditions of electrolysis temperature of 20° C. and current density of 1 A/dm².

A suspension material was not placed in the electrolytic solution. As a result of performing refining after the foregoing electrolysis, the Pb content was 200 ppm and the Bi content was 20 ppm. The respective contents of U and Th were 0.01 ppm and 0.006 ppm. This resulted in an impurity level that was not much different from the raw material.

The deposited electrolytic tin was dissolved and cast at a temperature of 240° C. to prepare a tin ingot. The cast tin ingot was stored for 6 months in an argon atmosphere. As a result of checking α dose after the lapse of 6 months, α ray count was 8.0 cph/cm². The analytical values of the refined tin are similarly shown in Table 1.

The respective contents of U and Th as radioactive elements were not 5 ppb or less, the respective contents of Pb and Bi that emit radiation α particles were not 1 ppm or less, and the α ray count was not 0.001 cph/cm² or less. These values did not satisfy the target of the present invention. The obtained material was not suitable for the manufacture of semiconductor devices.

Example 5

Tin Alloy Comprised of 0.5% Cu, 3% Ag and Remnant Sn

The high purity tin manufactured in Example 1 was prepared. As the additive elements of tin alloy in this Example, commercially available silver and copper were purified through electrolysis to obtain Ag of 5N5 and Cu of 6N. These additive elements were added to the foregoing high purity tin, which was dissolved and cast in an inert atmosphere at a temperature of 260° C. to manufacture a Sn—Cu—Ag alloy ingot comprised of 0.5% Cu, 3% Ag, and remnant Sn.

The cast tin ingot was stored for 6 months in an argon gas atmosphere. As a result of checking α dose after the lapse of 6 months, α ray count was 0.0007 cph/cm². The analytical values of the tin alloy are shown in Table 2.

The respective contents of U and Th as radioactive elements were 5 ppb or less, the respective contents of Pb and Bi that emit radiation α particles were 1 ppm or less, and α ray count was 0.001 cph/cm² or less. These values satisfied the target of the present invention. It was thereby possible to obtain a high purity tin material that is suitable for the manufacture of semiconductor devices.

Example 6

Tin Alloy Comprised of 3.5% Ag and Remnant Sn

The high purity tin manufactured in Example 1 was prepared. As the additive element of tin alloy in this Example, commercially available Ag was dissolved in nitric acid, HCl was added thereto to deposit AgCl, and this was further subject to nitrogen reduction to obtain high purity Ag of 5N. This additive element was added to the foregoing high purity tin, which was dissolved and cast in an inert atmosphere at a temperature of 260° C. to manufacture a Sn—Ag alloy ingot comprised of 3.5% Ag and remnant Sn.

The cast tin ingot was stored for 6 months in an argon gas atmosphere. As a result of checking a dose after the lapse of 6 months, α ray count was 0.0005 cph/cm$^2$. The analytical values of the tin alloy are shown in Table 2.

The respective contents of U and Th as radioactive elements were 5 ppb or less, the respective contents of Pb and Bi that emit radiation α particles were 1 ppm or less, and α ray count was 0.001 cph/cm$^2$ or less. These values satisfied the target of the present invention. It was thereby possible to obtain a high purity tin material that is suitable for the manufacture of semiconductor devices.

Example 7

Tin Alloy Comprised of 9% Zn and Remnant Sn

The high purity tin manufactured in Example 1 was prepared. As the additive elements of tin alloy in this Example, commercially available silver and zinc were purified through electrolysis to obtain Zn of 6N. These additive elements were added to the foregoing high purity tin, which was dissolved and cast in an inert atmosphere at a temperature of 260° C. to manufacture a Sn—Zn alloy ingot comprised of 9% Zn and remnant Sn.

The cast tin ingot was stored for 6 months in an argon gas atmosphere. As a result of checking a dose after the lapse of 6 months, α ray count was 0.0008 cph/cm$^2$. The analytical values of the tin alloy are shown in Table 2.

The respective contents of U and Th as radioactive elements were 5 ppb or less, the respective contents of Pb and Bi that emit radiation α particles were 1 ppm or less, and α ray count was 0.001 cph/cm$^2$ or less. These values satisfied the target of the present invention. It was thereby possible to obtain a high purity tin material that is suitable for the manufacture of semiconductor devices.

Comparative Example 2

Tin Alloy Comprised of 0.5% Cu, 3% Ag and Remnant Sn

The high purity tin manufactured in Example 1 was prepared. As the additive elements of tin alloy in this Example, commercially available silver and copper having a purity level of 3N were used. These additive elements were added to the foregoing high purity tin, which was dissolved and cast in an inert atmosphere at a temperature of 260° C. to manufacture a Sn—Cu—Ag alloy ingot comprised of 0.5% Cu, 3% Ag, and remnant Sn.

The cast tin ingot was stored for 6 months in an argon gas atmosphere. As a result of checking a dose after the lapse of 6 months, α ray count was 0.1 cph/cm$^2$. The analytical values of the tin alloy are shown in Table 2.

The respective contents of U and Th as radioactive elements were not 5 ppb or less, the respective contents of Pb and Bi that emit radiation α particles were not 1 ppm or less, and α ray count was not 0.001 cph/cm$^2$ or less. These values did not satisfy the target of the present invention. The obtained material was not suitable for the manufacture of semiconductor devices.

Comparative Example 3

Tin Alloy Comprised of 3.5% Ag and Remnant Sn

The high purity tin manufactured in Example 1 was prepared. As the additive element of tin alloy in this Example, commercially available Ag having a purity level of 3N was used. This additive element was added to the foregoing high purity tin, which was dissolved and cast in an inert atmosphere at a temperature of 260° C. to manufacture a Sn—Ag alloy ingot comprised of 3.5% Ag and remnant Sn.

The cast tin ingot was stored for 6 months in an argon gas atmosphere. As a result of checking a dose after the lapse of 6 months, α ray count was 0.03 cph/cm$^2$. The analytical values of the tin alloy are shown in Table 2.

The respective contents of U and Th as radioactive elements were not 5 ppb or less, the respective contents of Pb and Bi that emit radiation α particles were not 1 ppm or less, and α ray count was not 0.001 cph/cm$^2$ or less. These values did not satisfy the target of the present invention. The obtained material was not suitable for the manufacture of semiconductor devices.

Comparative Example 4

Tin Alloy Comprised of 9% Zn and Remnant Sn

The high purity tin manufactured in Example 1 was prepared. As the additive elements of tin alloy in this Example, commercially available silver and zinc having a purity level of 3N were used. These additive elements were added to the foregoing high purity tin, which was dissolved and cast in an inert atmosphere at a temperature of 260° C. to manufacture a Sn—Zn alloy ingot comprised of 9% Zn and remnant Sn.

The cast tin ingot was stored for 6 months in an argon gas atmosphere. As a result of checking a dose after the lapse of 6 months, α ray count was 0.5 cph/cm$^2$. The analytical values of the tin alloy are shown in Table 2.

The respective contents of U and Th as radioactive elements were not 5 ppb or less, the respective contents of Pb and Bi that emit radiation α particles were not 1 ppm or less, and the α ray count was not 0.001 cph/cm$^2$ or less. These values did not satisfy the target of the present invention. The obtained material was not suitable for the manufacture of semiconductor devices.

TABLE 2

| Element | Example 5 | Example 6 | Example 7 | Comparative Example 2 | Comparative Example 3 | Comparative Example 4 |
|---|---|---|---|---|---|---|
| Al | <0.01 | <0.01 | <0.01 | <0.01 | <0.01 | <0.01 |
| S | 7 | 6 | 6 | 22 | 10 | 8 |
| Fe | <0.01 | <0.01 | <0.01 | 6.4 | 3.2 | 8.4 |
| Co | <0.1 | <0.1 | <0.1 | 1.5 | 1.2 | 4.0 |
| Ni | <0.1 | <0.1 | <0.1 | <0.1 | <0.1 | 8.0 |
| Cu | — | 0.3 | 2.3 | — | 9.8 | 2.3 |

TABLE 2-continued

| Element | Example 5 | Example 6 | Example 7 | Comparative Example 2 | Comparative Example 3 | Comparative Example 4 |
|---|---|---|---|---|---|---|
| As | 0.05 | <0.05 | 0.05 | 1.4 | 0.5 | 7 |
| Cd | <0.05 | <0.05 | <0.05 | 0.2 | 0.1 | 0.8 |
| In | <1 | <1 | <1 | 1 | <1 | 2 |
| Sb | <0.5 | <0.5 | <0.5 | 1.0 | 0.5 | 1.5 |
| Te | <0.1 | 0.1 | <0.1 | 0.8 | 0.4 | 4.1 |
| Pb | 0.6 | 0.6 | 0.8 | 7.8 | 6.0 | 15.8 |
| Bi | 0.1 | 0.15 | 0.1 | 0.6 | 0.5 | 1.0 |
| U | <0.005 | <0.005 | <0.005 | 0.005 | <0.005 | <0.005 |
| Th | <0.005 | <0.005 | <0.005 | <0.005 | <0.005 | 0.007 |
| α dose | 0.0007 | 0.0005 | 0.0008 | 0.1 | 0.03 | 0.5 |

Content of respective elements: wtppm; α dose: cph/cm$^2$.

As described above, since the present invention enables provision of high purity tin having a purity of 5N or higher (provided that this excludes the gas components of O, C, N, H, S and P), and in which the respective contents of U and Th as radioactive elements are 5 ppb or less, the respective contents of Pb and Bi that emit radiation α particles are 1 ppm or less, and α ray count of high purity tin having a cast structure is 0.001 cph/cm$^2$ or less. It is therefore possible to eliminate as much as possible the influence of α ray on semiconductor chips. Accordingly, since it is possible to significantly reduce the occurrence of soft errors caused by the influence of α ray of semiconductor devices, the present invention is useful as a material to be used at locations where tin is to be used as the soldering material or the like.

We claim:

1. A method of manufacturing a high purity tin, consisting of the steps of:
   leaching a raw material tin with an acid to obtain a tin leachate, the raw material tin having a purity of 2N to 3N level,
   while suspending in the tin leachate one or more adsorbents selected from the group consisting of titanium oxide, aluminum oxide, tin oxide, activated carbon and carbon to adsorb impurities and make the tin leachate a purified electrolyte, performing electrolysis at a temperature of 10-80° C. with a current density of 0.1-50 A/dm$^2$ by using the purified electrolyte and an anode of a raw material tin having a purity of 2N to 4N level, and obtaining an electrolytically-refined tin having a purity of 5N or higher excluding gas components of O, C, N, H, S and P, a content of each of U and Th of 5 ppb or less, and a content of each of Pb and Bi of 1 ppm or less,
   melting, which is followed by casting, the electrolytically-refined tin at a temperature of 250 to 500° C., to form an ingot, and
   keeping the ingot in an inert gas atmosphere or in vacuum for 6 months or longer to obtain a high purity tin having an α ray count of 0.001 cph/cm$^2$ or less.

2. A method of manufacturing a high purity tin alloy, consisting of the steps of:
   leaching a raw material tin with an acid to obtain a tin leachate, the raw material tin having a purity of 2N to 3N level;
   while suspending in the tin leachate one or more adsorbents selected from the group consisting of titanium oxide, aluminum oxide, tin oxide, activated carbon and carbon to adsorb impurities and make the tin leachate a purified electrolyte, performing electrolysis at a temperature of 10-80° C. with a current density of 0.1-50 A/dm$^2$ by using the purified electrolyte and an anode of a raw material tin having a purity of 2N to 4N level, and obtaining an electrolytically-refined tin having a purity of 5N or higher excluding gas components of O, C, N, H, S and P, a content of each of U and Th of 5 ppb or less, and a content of each of Pb and Bi of 1 ppm or less;
   adding alloy material of which purity is the same or higher as the electrolytically-refined tin to the electrolytically-refined tin to form a mixture;
   melting, which is followed by casting, the mixture at a temperature of 250 to 500° C., form an ingot; and
   keeping the ingot in an inert gas atmosphere or in vacuum for 6 months or longer to obtain a high purity tin alloy having a purity of 5N or higher excluding gas components of O, C, N, H, S and P and an α ray count of 0.001cph/cm$^2$ or less.

* * * * *